United States Patent
Hui et al.

(10) Patent No.: US 6,914,492 B2
(45) Date of Patent: Jul. 5, 2005

(54) DIGITAL PROGRAMMABLE DELAY SCHEME WITH AUTOMATIC CALIBRATION

(75) Inventors: Keven Hui, Union City, CA (US); Hong Hao, Saratoga, CA (US)

(73) Assignee: LSI Logic Corporation, Milpitas, CA (US)

( * ) Notice: Subject to any disclaimer, the term of this patent is extended or adjusted under 35 U.S.C. 154(b) by 109 days.

(21) Appl. No.: 10/671,352

(22) Filed: Sep. 25, 2003

(65) Prior Publication Data

US 2005/0068110 A1 Mar. 31, 2005

(51) Int. Cl.$^7$ .......................... H03H 11/26; H03B 5/24
(52) U.S. Cl. ........................................ 331/57; 327/262
(58) Field of Search .............. 331/44, 57; 327/261–162

(56) References Cited

U.S. PATENT DOCUMENTS 5,241,429 A * 8/1993 Holsinger .................... 360/46

* cited by examiner

Primary Examiner—David Mis
(74) Attorney, Agent, or Firm—Suiter West Swantz PC LLO (57) ABSTRACT

The digital programmable delay scheme with automatic calibration is an alternative to PLLs, DLLs, fixed delay cells and other methods of delay. The method and circuit sets a delay in a programmable delay cell in an oscillator circuit and uses a reference clock to calibrate the oscillator clock frequency. The programmable delay, once set, may then be used to determine a desired delay for a signal that passes through the programmable delay cell as well as another portion of the oscillator circuit. The circuit preferably uses two counters that are controlled by calibration and control logic in which one counter is clocked by the reference clock and the other is clocked by the oscillator circuit clock. After a predetermined time, the calibration and control logic compares the two count values and determines if the programmable delay cell of the oscillator circuit needs to be adjusted. If the oscillator circuit is determined to need adjustment, the calibration and control logic circuit so adjusts the programmable delay cell. The resulting circuit is small, flexible, and PVT calibrated and consumes very little power. It can be used with any reference clock to support various timing requirements at different frequencies.

32 Claims, 7 Drawing Sheets

DIGITAL PROGRAMMABLE DELAY SCHEME WITH AUTOMATIC CALIBRATION

FIELD OF THE INVENTION

The present invention generally relates to the field of timing in integrated circuits, and particularly to controlling a delay along a signal path for a high speed integrated circuit signal.

BACKGROUND OF THE INVENTION

Delay circuits are used to shift signals and/or set oscillator frequencies. A common oscillator circuit is created through a series of stages in which the output of one stage is input to the next state and the output of the last stage of the oscillator is fed back to the first stage of the oscillator. Each stage of an oscillator represents a propagation delay. For example, three inverters connected in series in which the output of the last inverter is input to the first inverter creates an oscillator in which an oscillator clock frequency has a period equal to twice the sum of the propagation delays of each inverter.

The current state of timing delay technology is faced with four major issues. First, it is desirable to accurately and relatively easily program and set the delay to the desired value with the actual circuits. As the clock speed gets faster and the die becomes denser, the available timing budget is quickly reduced. That increases the need for a robust and accurate way to shift a signal. Second, as the clock rate increases in digital integrated circuits, it becomes more challenging to accurately maintain the clock signal at a desired frequency over PVT (process, voltage, and temperature) variations. Process, voltage, and temperature behavior varies from device to device, with given tolerances. Unfortunately, these variations also change the value of the delay. It is absolutely necessary to have the ability to calibrate and adjust the delay whenever there is a need. Third, it is desirable to program and set the delay and calibrate the delay while using minimal power and die area. It is important to design with as few cells (i.e., thus, permitting a smaller die area) and as low power consumption as possible to have a competitive advantage. Fourth, flexibility of the techniques if advantageous. As the complexity of circuit designs grow, so does the need to support various timing and speed requirements. It would be advantageous to have a scheme to support the different requirements for different applications.

There are many ways to shift a signal, each way having its advantages and disadvantages. So far, analog phase locked loops (PLLs), delayed-locked loops (DLLs), fixed delay cells, and some forms of digital delay scheme have been used to address these issues. Unfortunately, none of the current solutions have been able to solve all of the above problems. Although PLLs and DLLs are proven techniques to retime the clock or delay the clock 90, 180, or 270 degrees and to calibrate and adjust the delay and/or frequency over PVT, they consume a relatively large amount of power, usually require large die area, are very sensitive to switching noise, and are usually limited to shifts of 90, 180, 270 and 360 degrees only. Fixed delay cells, an alternative to PLLs and DLLs, are small and easy to use, but they are not PVT calibrated and they are limited to one frequency only. These and other currently available digital delay schemes are performed for some specific applications, but they lack the flexibility and require too much die area for the current and forthcoming technology.

Therefore, it would be desirable to provide a timing delay scheme that is easy to calibrate and is able to adjust the delay in small time increments for applications such as oscillator circuits.

SUMMARY OF THE INVENTION

Accordingly, the present invention is directed to a method and circuit for setting a programmable delay cell value using a reference clock and determining an oscillator clock frequency using the programmable delay cell value.

In a first aspect of the present invention, a programmable delay circuit with automatic calibration includes a calibration and control logic circuit that receives a first signal generated in response to a reference clock and a second signal generated in response to an oscillator clock that is generated by an oscillator circuit. The oscillator circuit includes a signal path having a programmable delay cell that is set by the calibration and control logic circuit. After calibration, the oscillator circuit may be disabled to permit use of the signal path by a signal such as a clock or strobe signal.

In a second aspect of the present invention, a method for generating a phase delay includes the steps of entering a desired phase delay for a oscillator clock and generating the oscillator clock from an oscillator. Then, a first signal is generated in response to the reference clock and a second signal is generated in response to the oscillator clock. The first and second signals are compared. Based on the comparison of the first and second signals and the desired phase delay, a programmable delay is provided to the oscillator that is used to determine a frequency of the oscillator clock.

The present invention overcomes shortcomings of the current techniques. The present invention has the ability to accurately and relatively easily program and set the delay to the desired value with the actual circuits in which the accuracy will depend on the step size of the programmable delay cell. Using current technology, designing a delay cell with the step sizes of 20 picoseconds or smaller is quite achievable. The present invention can set the desired delay to within one step size. The present invention has the ability to calibrate the set delay for process, voltage, and temperature variations by allowing each delay network or device to adjust the delay of its programmable delay cell. The method and circuit of the present invention uses minimal power and die area. With the exception of the programmable delay cell, all other cells used to design the logic are not timing critical. After the calibration mode, the counters and the rest of the logic may be disabled to save power. Since the programmable delay cell and clock buffers are also used in the actual circuit, there is almost no additional power consumption.

It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiments of the invention, examples of which are illustrated in the accompanying drawings.

The present invention relates to a method and circuit for setting a programmable delay cell in a signal path and using a reference clock to calibrate the oscillator clock frequency of an oscillator that includes the delay cell. The circuit preferably uses two counting circuits or counters that are controlled by calibration and control logic in which one counter is clocked by the reference clock and the other is clocked by the oscillator circuit clock. In general, after a predetermined time, the calibration and control logic compares the two count values and determines if the programmable delay cell of the oscillator circuit needs to be adjusted. In a preferred embodiment, the sequence followed in the method is to clear the counters, start the counters, stop the counters, compare the counts, and, then, accordingly adjust the programmable delay cell value and/or repeat the earlier steps. If the oscillator circuit is determined to need adjustment, the calibration and control logic circuit so adjusts the programmable delay cell. The present invention may then provide a suitable delay path formed from a portion of the oscillator circuit for passing an external or source clock signal.

Figure 1:
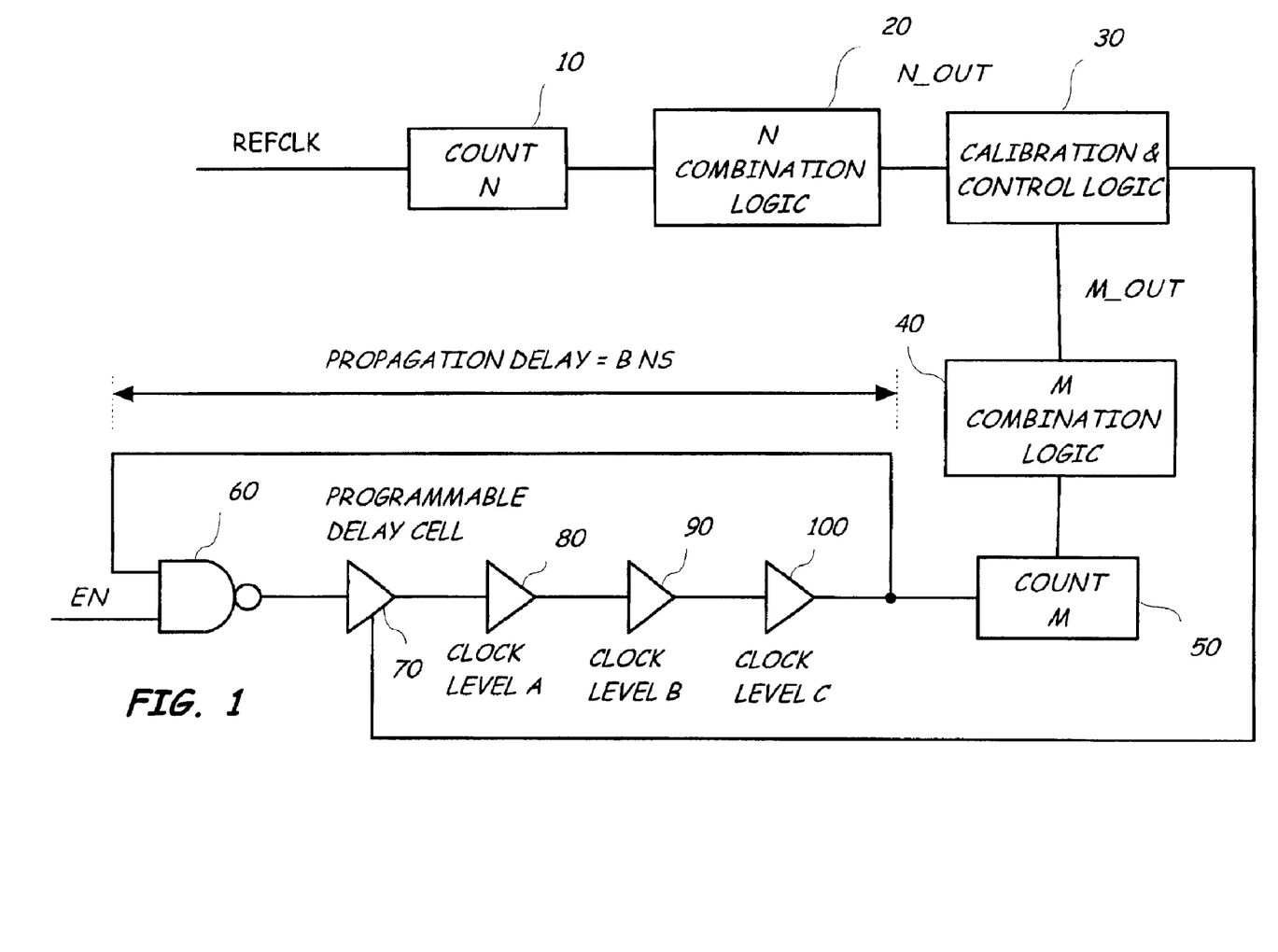
FIG. 1 illustrates a functional block diagram of an embodiment of a circuit of the present invention.

FIG. 1 shows a functional block diagram of an embodiment of a circuit of the present invention. As shown in FIG. 1, the major components of the scheme are two counters 10, 50, calibration and control logic 30, and an oscillator 60–100 that includes a programmable delay cell 70. The programmable delay cell 70 may be implemented through complementary metal oxide semiconductor (CMOS) inverters, differential delay cells, buffers and multiplexers, or the like. The oscillator is preferably a ring oscillator. The first counter 10 is clocked by a reference clock REFCLK and the second counter 50 is clocked by the clock generated by the ring oscillator. The first counter 10 and the second counter 50 are capable of counting up to a certain number and resetting to begin counting again. In a preferred embodiment, the total size of the circuit is determined by the size of the programmable delay cell 70 and a few hundred logic gates. Except for the programmable delay cell, all other cells used to design the logic are not timing critical. In one embodiment, the calibration and control logic 30 starts both counters simultaneously and stops the counters simultaneously after a predetermined period of time. Then, the calibration and control logic 30 compares the count values to determine the operating frequency of the oscillator clock with respect to the reference clock. Optionally, prior to the calibration and control logic 30, combination logic 20 and 40 may be used to generate the waveforms shown in FIG. 2. Any correctable discrepancy determined by the calibration and control logic is resolved by making an adjustment to the programmable delay cell. If the programmable delay cell is adjustable only in increments, the calibration and control logic or other calculating and control circuitry provides the nearest delay value to the programmable delay cell to approximate the desired frequency of the oscillator clock.

Figure 2:
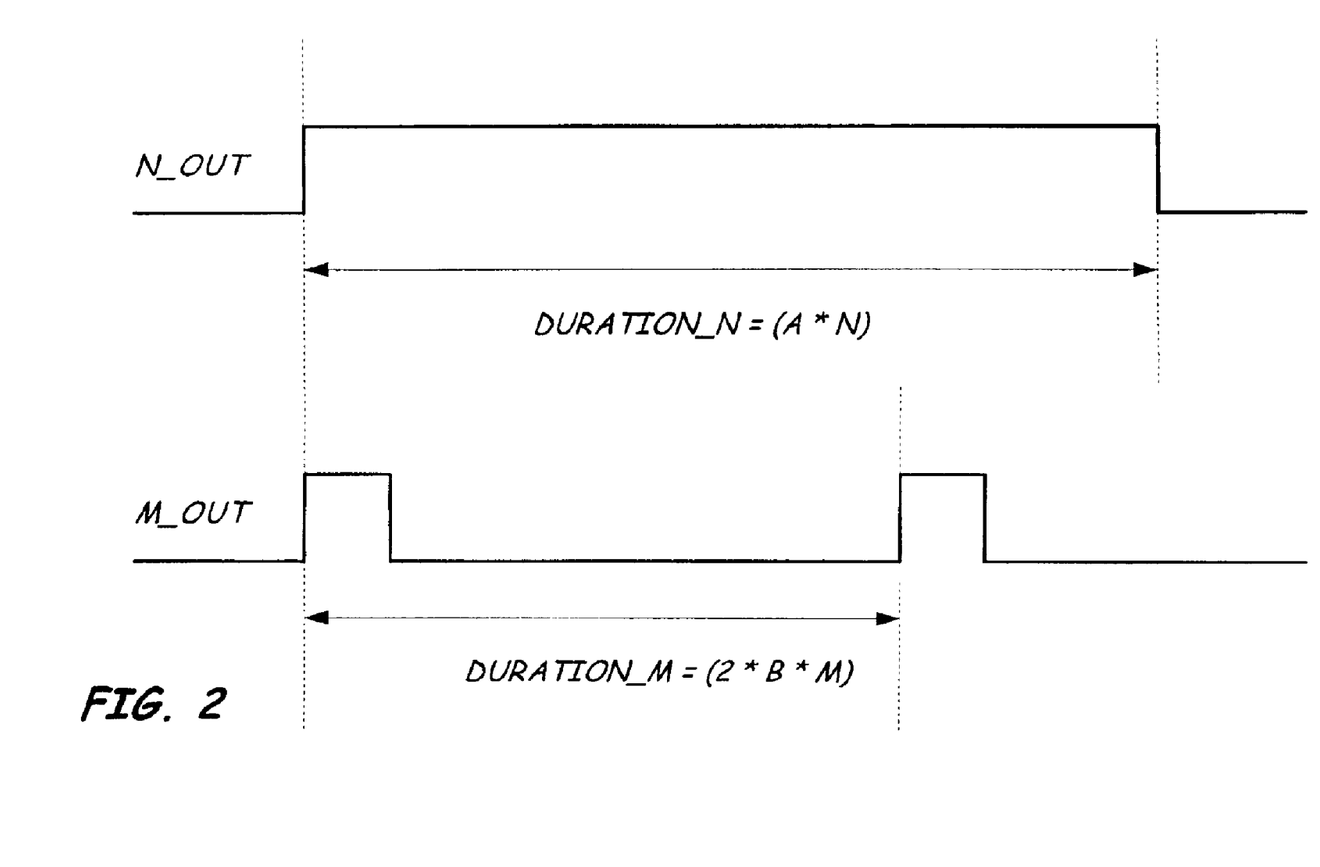
FIG. 2 illustrates a timing diagram of the reference clock and oscillator clock representational waveforms of an embodiment of the present invention.

FIG. 2 shows a timing diagram relating inputs to the calibration and control logic. The reference clock counter generated pulse N_out, one of the two illustrated inputs, is shown as having a duration of $A*N$ where N represents the number of counts before reset by the reference clocked counter 10 and A represents the clock period of REFCLK. The period of the reference clock REFCLK is given as A nanoseconds although a different unit of time may be used, such as picoseconds, microseconds, or milliseconds. Thus, the duration of N_out (from the beginning to the end of the count) is $A*N$. Similarly, if the propagation delay of the ring oscillator is given as B nanoseconds (or other unit of time such that A and B are measured in the same units of time), then the period of the ring oscillator is given as $2*B$ nanoseconds. If the number of cycles Count_M counted by the ring oscillator counter is M, then the duration of M_out (from beginning to end of the count) is $2*B*M$. The waveform M_out may be a low duty cycle waveform as shown in FIG. 2 in which the high level pulse occupies a relatively small portion of the count period or may be a 50—50 duty cycle waveform or a high duty cycle waveform.

The present invention uses the reference clock as a guide for setting the ring oscillator frequency through the programmable delay cell. For example, if it is desired that the oscillator clock frequency be twice the reference frequency, the programmable delay cell is set (to the closest approximation or exactly) to 90 degrees of the period A; in other words, B is set to $A/4$ (equation 1). If Duration_N equals Duration_M by adjusting the delay of the programmable delay cell, then $A*N=2*B*M$ (equation 2). Substituting $B=A/4$ yields $M=2*N$ (equation 3). Thus, satisfying equations 1 and 2 provides equation 3. In the case where the desired programmable delay is 90 degrees, the counter value of Count_M is set equal to twice the number of Count_N. For the purposes of this example, the value of the left side of equation 2, $A*N$, is fixed. In order to satisfy equation 2, the value of B may be changed by adjusting the delay of the programmable delay cell until $2*B*M$ equals $A*N$. In one embodiment, the calibration and control logic (or similar circuitry) detects the durations of Duration_N and Duration_M and sends control settings to adjust the delay of the programmable delay cell until it finds the two durations are equal. Once equations 2 and 3 are satisfied, the propagation delay of the ring oscillator will be one fourth of the period of the reference clock A. For any given frequency of the reference clock, M and N can be properly chosen to get the desired phase shift/delay. Then the counters may be deactivated to save power as well as to reduce switching noise. No PVT variations will change the counter values or the period of the reference clock (i.e., the values of M, N and A remain the same). In the case of multiple circuits, each delay network (or device) of an oscillator circuit will adjust the delay of its programmable delay cell to satisfy equation 2. Thus, the value of B for different delay networks or different devices will still be the same regardless of the PVT conditions. Thus, B is the only variable for adjusting oscillator clock frequency and/or setting a delay.

Figure 3:
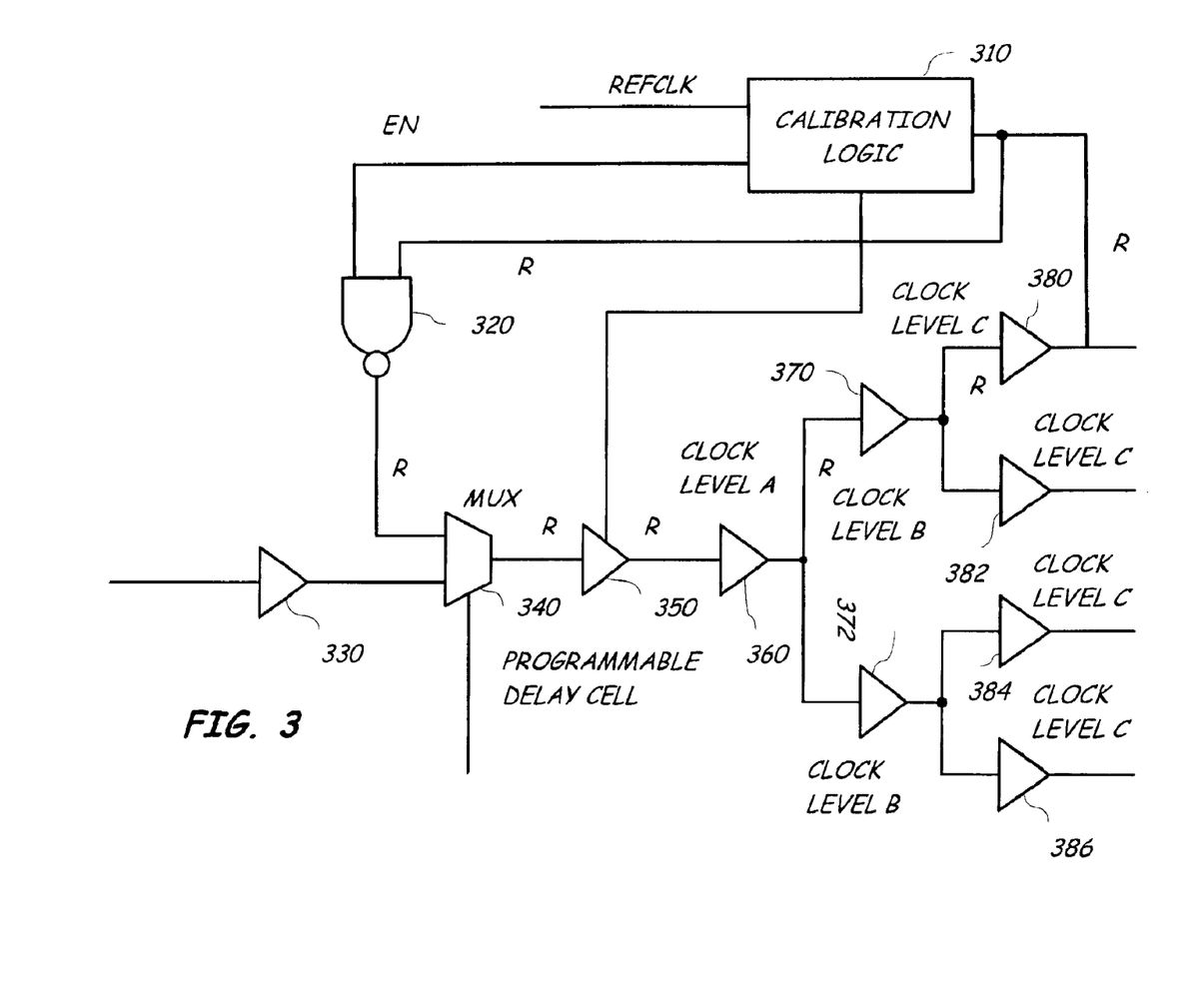
FIG. 3 illustrates a functional block diagram of an embodiment of a circuit of the present invention integrated into a clock tree.

FIG. 3 shows a functional block diagram an embodiment of the circuit in which the delay scheme is embedded into a clock tree circuit. The path R is the ring oscillator, which consists of a NAND gate 320, a multiplexer 340, the programmable delay cell 350, and three clock buffers 360, 370, and 380. The reference clock REFCLK may be provided by an off chip voltage controlled oscillator, a crystal oscillator, or the like, proximately disposed to the ring oscillator circuit. The resolution of the programmable delay buffer increments determines a number of cycles needed in a count cycle and the delay adjustment (or, deskew) capability. With reasonably sized counters, the circuit can accurately set the delay settings. The accuracy depends on the step size of the programmable delay cell. The present invention can set the desired delay to within one step size and has the ability to calibrate the set delay for process, voltage, and temperature variations for every device used with it. Using current technology, designing a delay cell with the step sizes of 20 picoseconds or smaller is quite achievable. The clock tree in FIG. 3 may have two, three, four, or more levels and may use temporary clock nets each of which are turned on or off independently, as described in U.S. Pat. No. 6,429,714, entitled "Process, voltage and temperature independent clock tree deskew circuitry-temporary driver method," herein incorporated by reference in the entirety. The clock tree may be implemented through various combinations of transistors, resistors, capacitors, flip flops, electrically erasable programmable read only memory, microcontroller, firmware, flash memory, and the like. Each level of the clock tree may be phase detectable and phase adjustable (or, skew detectable and skew adjustable).

The calibration and control logic circuit preferably performs Boolean and arithmetic operations. During the calibration mode, the multiplexer 340 selects the R path. The calibration logic continues to adjust the delay of the programmable delay cell until it finds the desired delay value. Then, the multiplexer 340 switches input to the other input. The desired phase/delay includes the delay of the programmable delay cell as well as the propagation delay of the whole clock network. The delay is also adjusted to current conditions of processing, voltage, and temperature. That eliminates the need of delay adjustment on the data path. Once the period of the reference clock and the values of the two counters are set, the desired delay will be the same device to device although the delay settings to the programmable delay cells will not necessarily be the same. This is because process, voltage, and temperature might not be the same for different devices.

Since the delay along the clock nets of the clock tree connected to the initial "clock" buffer may not be identical due to intra die interconnect process variations and due to different neighboring routes, the first level of clock buffers may not all turn on at the same time. Additional differences in turn on times may be caused by intra die transistor variation, variations in signal line lengths, and differing capacitive effects. However, the input signal paths of each clock buffer 360, 370, 372, 380, 382, 384, and 386 of a given level may be designed to be of the same length, to have a symmetric layout with other input signal paths of the same level, and to have a layout similar in other respects such as to experience various environmental affects, such as parasitic capacitance, in the same way and to the same degree. Thus, the clock signal into each level of clock buffer is presumed to be identical to the clock signal of the other clock buffers of the same level (e.g., 380, 382, 384, and 386). In other words, the clock buffer signal paths are balanced which results in fewer and minimal adjustments. The path distances of a clock tree used with the oscillator circuit having a programmable delay cell may be balanced and symmetric to enhance the synchronization of the clock signals in different branches of the clock tree.

After the calibration mode, the counters and the rest of the logic can be disabled to save power. In FIG. 3, the oscillator circuit path R may be disabled by disabling NAND gate 320 while a signal path is still provided that has a desired propagation delay value. Then, an external clock (or, source clock) 330 may be switched through by multiplexer 340 to provide a clock signal with a desired delay value. Since the programmable delay cell and clock buffers are also used in the actual circuit, there is almost no additional power consumption.

Figure 4:
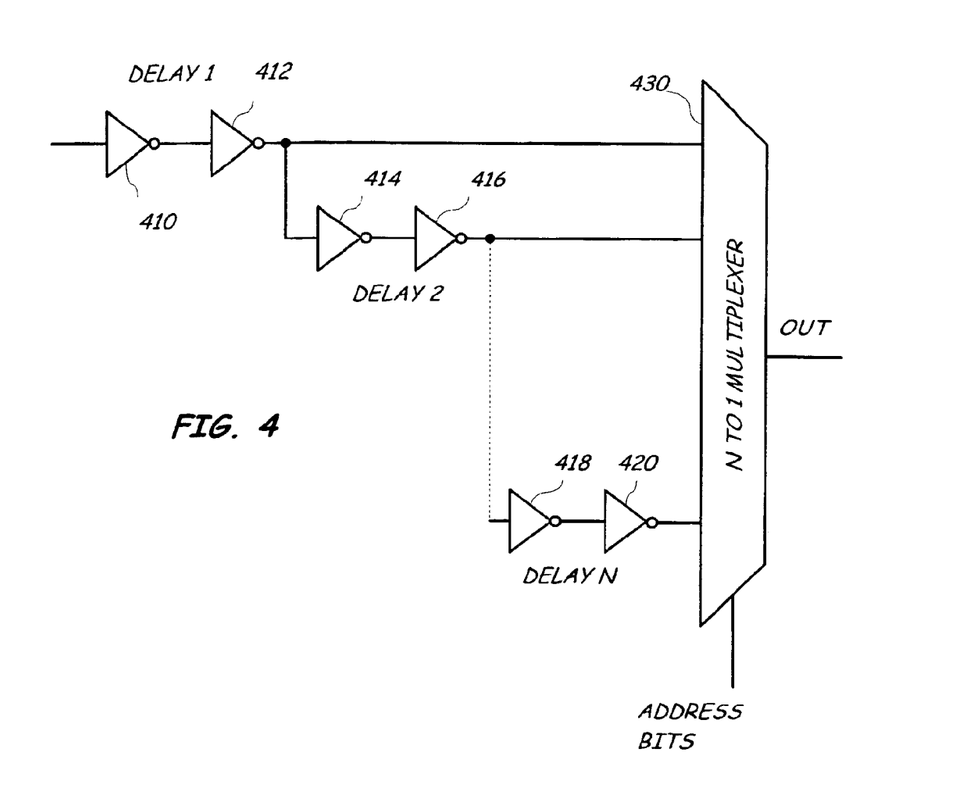
FIG. 4 illustrates a first embodiment of a programmable delay cell in which one of several delays is selected by a multiplexer.
Figure 5:
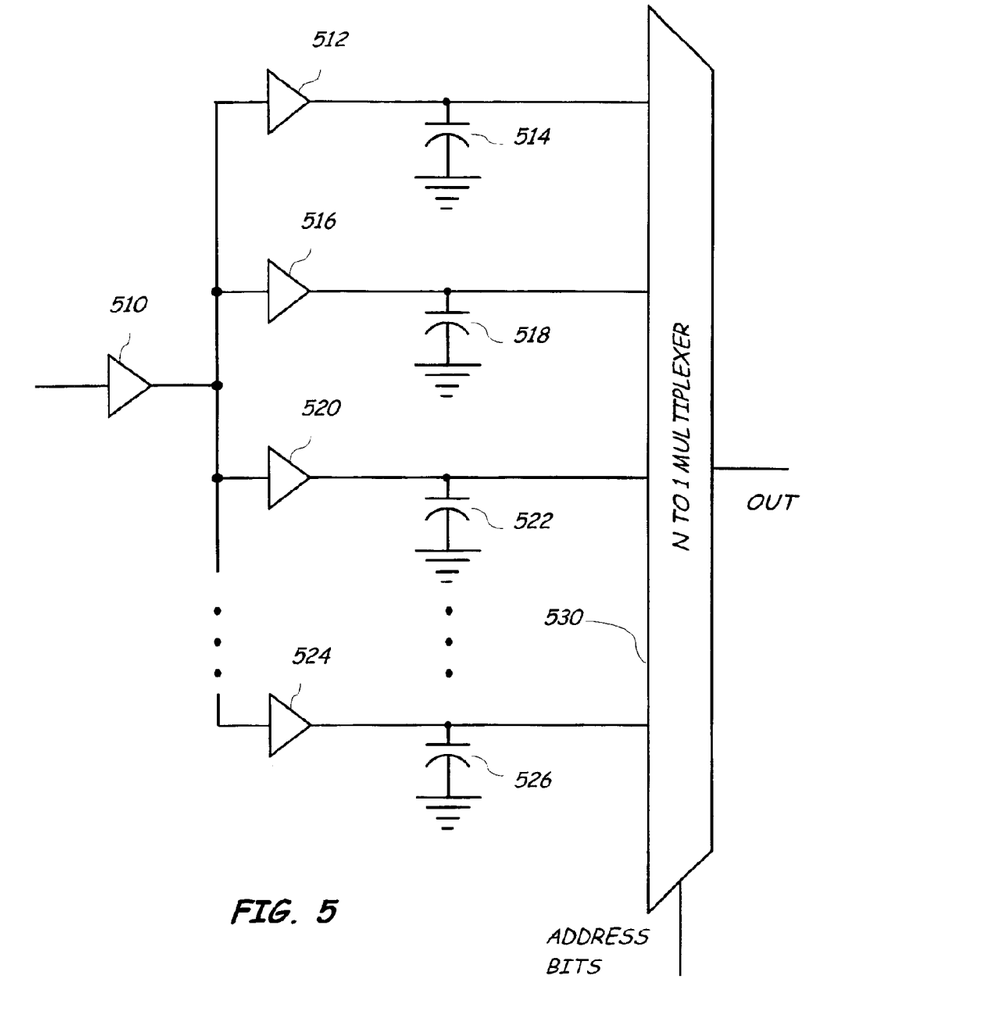
FIG. 5 illustrates a second embodiment of a programmable delay cell in which one of several capacitive delays is selected by a multiplexer.
Figure 6:
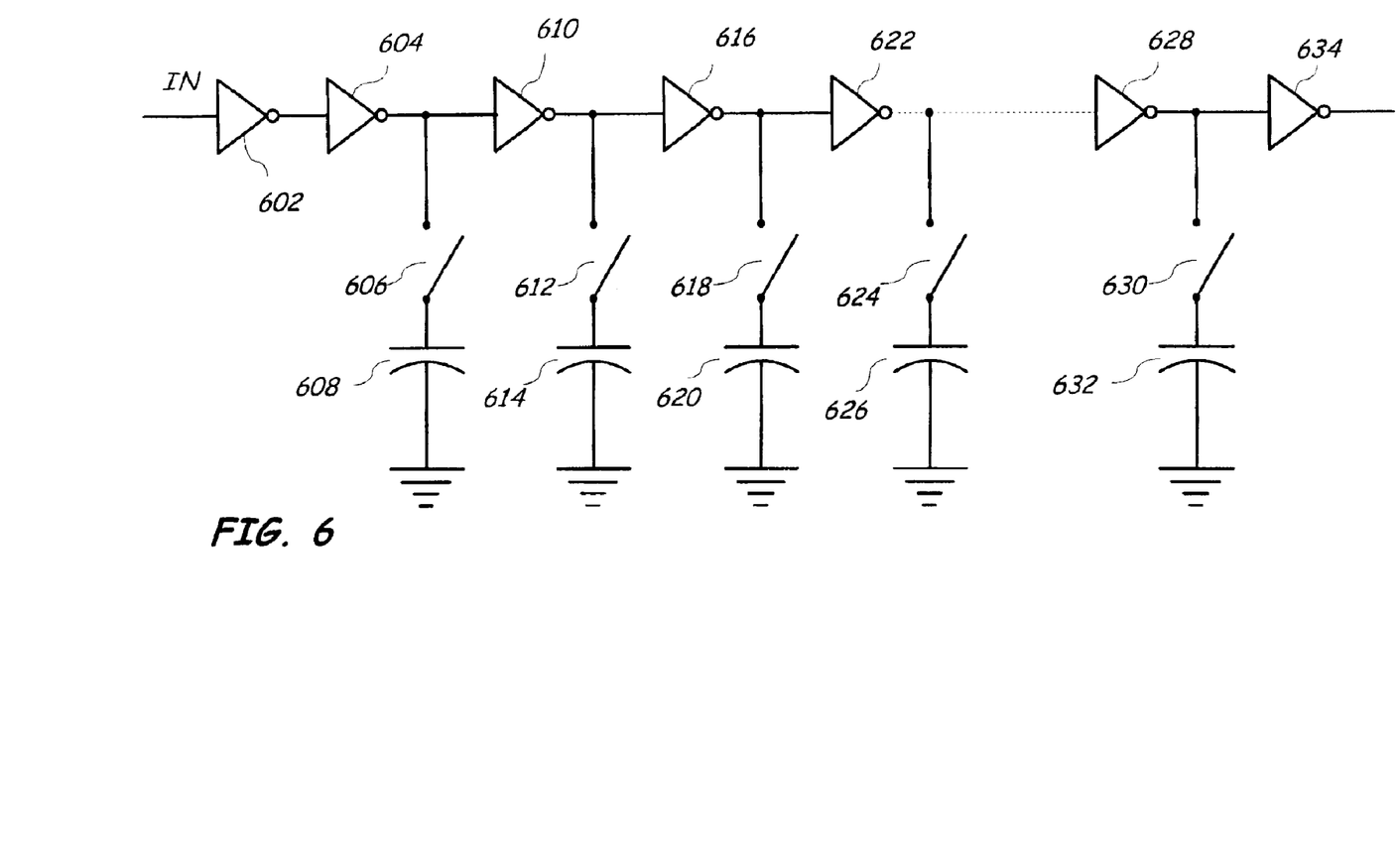
FIG. 6 illustrates a third embodiment of a programmable delay cell in which capacitances switchably connect an input of a stage in the programmable delay cell to ground.

The programmable delay cell may be implemented in numerous configurations. FIGS. 4–6 illustrate three examples of implementations of the programmable delay cell. Features of the various implementations may be combined to achieve desired operational results. FIG. 4 shows a multiplexer 430 that selects one of N delays through the value of the address bits input to the multiplexer. Each delay each is formed of a pair of serial inverters 410–412, 414–416, and 418–420. FIG. 5 shows a multiplexer 530 that selects one of N delays determined by a selected input that is tied to a unique capacitive load in which a higher capacitive value leads to a greater delay value because of the RC time constant established by the selected capacitance 514, 518, 522, 526 and multiplexer switch input resistance. The first stage buffer 510 and second stage buffers 512, 516, 520, 524 may be inverters. FIG. 6 shows an embodiment in which the delay is formed of a fixed number of stages 602, 604, 610, 616, 622, 628, 634 in which the input of one or more of the stages may be switchable connected to a capacitance 608, 614, 620, 626, 632 through a switch 606, 612, 618, 624, 630. The capacitances 608, 614, 620, 626, 632 may be of the same capacitive value, may each be of a unique capacitance value, may have capacitive values scaled in relation to the other capacitors, or the like. Other variations of the programmable delay cell are contemplated by the present invention.

Figure 7:
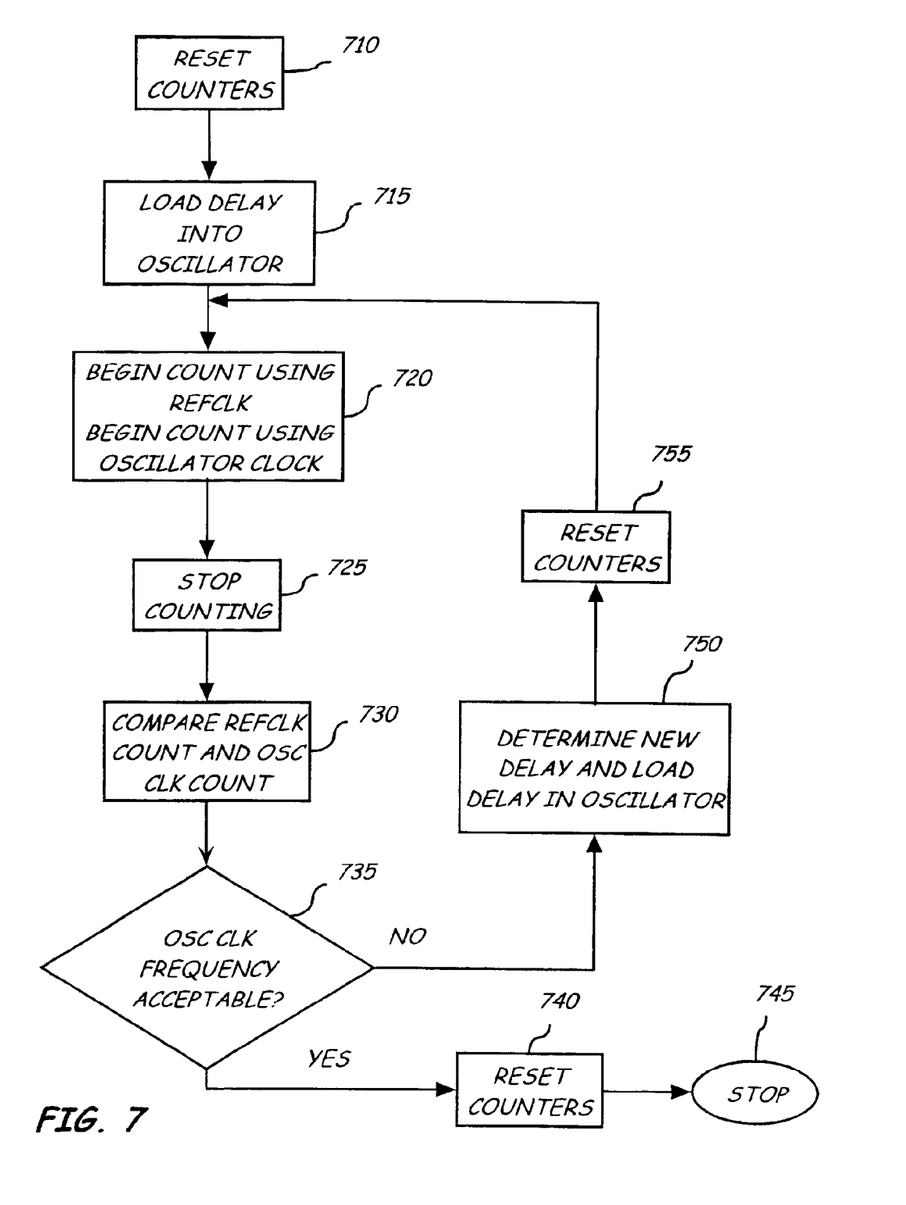
FIG. 7 illustrates an embodiment of a method of the present invention.

FIG. 7 illustrates an embodiment of a method of the present invention. The counters clocked by the reference clock REFCLK and the oscillator clock OSC CLK are cleared or reset 710. A delay is loaded into a stage of the oscillator 715 from the calibration and control circuit, through a latch loaded by an external device, or in another manner. Both counters are enabled simultaneously through the release of the reset line 720. The oscillator clock may be derived from the reference clock or may be generated through a ring oscillator. After a period of time, the counting is stopped simultaneously for the two counters 725. The stopping may be a function of the reference clock counter reaching a certain count value. Likewise, the oscillator clocked counter may determine the end of the count period. Alternatively, the calibration and control logic or other circuit may determine when to stop counting. The reference clocked count and the oscillator clocked count are compared 730. If the clocked count values are sent to the calibration and control logic, the comparison may be performed by an arithmetic logic unit or other circuitry. If reference clock counter generated pulse N_out and oscillator clock counter generated pulse M_out are sent to the calibration and control logic, the comparison may be performed using a shift register to measure the relative durations of the two pulses or a counting circuit may count the number of M_out pulses during the period of time N_out is a logic high value. If the oscillator clock frequency is determined to be within the desired parameters, such as within an acceptable range or of a desired value 735, the counters are reset 740 and calibration stops 745. Otherwise, a new delay is determined and the new delay value is loaded into the programmable delay cell of the oscillator 750, the counters are reset 755, and counting resumes 720.

The present invention may be practiced through a variety of implementations. For example, the counters of FIGS. 1 and 3 may be reset on a particular count, may be stopped by control logic, or may rollover continuously. The duty cycle of the waveforms generated from the counter outputs may be altered to comply with a particular application. The calibration and control logic may receive as input either a clock frequency the oscillator is to operate or a delay value. An initial delay value may be preset at the time of manufacture, may be set by dual in line switches, may be loaded into the calibration and control logic circuitry, or may otherwise be input. Periodic calibrations may be employed to guard against frequency drift problems. The reference clocked counter and the oscillator clocked counter preferably are reset together, but may be reset independently through the calibration and control logic, through an operator, or through other circuitry. The propagation delays of the counter and combination logic timed by the reference clock is preferably closely matched with or identical to the propagation delays of the counter and combination logic timed by the oscillator clock. Instead of combination logic that receives the count values and generates a corresponding waveform, the count may be provided directly to the calibration and control logic. An arithmetic logic unit may be used to compare the two count values.

It is believed that the present invention and many of its attendant advantages will be understood by the forgoing description. It is also believed that it will be apparent that various changes may be made in the form, construction and arrangement of the components thereof without departing from the scope and spirit of the invention or without sacrificing all of its material advantages, the form hereinbefore described being merely an explanatory embodiment thereof. It is the intention of the following claims to encompass and include such changes.

What is claimed is:

1. A digital programmable delay circuit with automatic calibration, comprising:
    means for receiving a reference clock signal and providing a first output signal that is generated from the reference clock signal;
    means for generating an oscillator signal, the means for generating an oscillator signal having a plurality of stages, one of the plurality of stages being programmable;
    means for receiving the oscillator signal and providing a second output signal that is generated from the oscillator signal; and
    means for receiving the first and second output signals and providing a third output signal based upon a relationship of the first and second output signals, the third output signal setting a delay of the programmable one of the plurality of stages.

2. The digital programmable delay circuit of claim 1, wherein the means for generating an oscillator signal includes a means for enabling the generation of an oscillator signal.

3. The digital programmable delay circuit of claim 1, wherein the means for receiving a reference clock signal has a first propagation delay and the means for receiving an oscillator signal has a second propagation delay, the first and second propagation delays being essentially identical.

4. The digital programmable delay circuit of claim 3, wherein the means for receiving a reference clock signal includes a first counter and a first output logic circuit and the means for receiving an oscillator signal includes a second counter and a second output logic circuit.

5. The digital programmable delay circuit of claim 4, wherein a number of stages of the first output logic circuit and a number of stages of the second output logic circuit are equal.

6. The digital programmable delay circuit of claim 4, wherein a propagation delay of the first output logic circuit essentially equals a propagation delay of the second output logic circuit.

7. The digital programmable delay circuit of claim 1, wherein the plurality of stages of the means for generating an oscillator signal is an odd number.

8. The digital programmable delay circuit of claim 1, wherein the plurality of stages of the means for generating an oscillator signal is an even number.

9. A method for generating a delay, comprising:
    entering a desired delay for an oscillator clock;
    generating the oscillator clock from an oscillator;
    generating a first signal in response to a reference clock;
    generating a second signal in response to the oscillator clock;
    comparing the first signal and the second signal; and
    based on the comparison of the first and second signals and the desired delay, providing a programmable delay to the oscillator that is used to determine a frequency of the oscillator clock.

10. The method of claim 9, wherein the oscillator is a ring oscillator.

11. The method of claim 9, wherein the programmable delay is approximately 20 picoseconds.

12. The method of claim 9, further comprising counting reference clock cycles as a first count value and generating the first signal through a Boolean operation using the first count value.

13. The method of claim 12, further comprising counting oscillator clock cycles as a second count value and generating the second signal through a Boolean operation using the second count value.

14. The method of claim 9, wherein the first and second signals are count values.

15. The method of claim 14, wherein calibration and control logic compares the count values of the first and second signals to determine if the programmable delay is to be adjusted.

16. The method of claim 15, wherein the method steps are repeated until the programmable delay is adjusted within desired parameters.

17. The method of claim 16, further comprising disabling the oscillator clock.

18. The method of claim 17, further comprising providing a source clock that is delayed by the programmable delay before providing a clock signal to a clock tree.

19. The method of claim 18, wherein a portion of the clock tree forms part of the oscillator.

20. A programmable delay circuit with automatic calibration, comprising:
    a calibration and control logic circuit that receives a first signal generated in response to a reference clock and a second signal generated in response to an oscillator clock; and an oscillator circuit that generates the oscillator clock, the oscillator circuit including a programmable delay cell having a delay that is set by the calibration and control logic circuit.

21. The programmable delay circuit with automatic calibration of claim 20, further comprising a first circuit that receives the reference clock and generates the first signal and a second circuit that receives the oscillator clock and generates the second signal.

22. The programmable delay circuit with automatic calibration of claim 20, further comprising a first counting circuit that is timed by the reference clock and that generates the first signal.

23. The programmable delay circuit with automatic calibration of claim 22, further comprising a second counting circuit that is timed by the oscillator clock and that generates the second signal.

24. The programmable delay circuit with automatic calibration of claim 23, wherein the oscillator circuit includes a plurality of stages.

25. The programmable delay circuit with automatic calibration of claim 24, wherein one of the plurality of stages is the programmable delay cell.

26. The programmable delay circuit with automatic calibration of claim 24, wherein at least one of the plurality of stages is a complementary metal oxide semiconductor inverter.

27. The programmable delay circuit with automatic calibration of claim 24, wherein at least one of the plurality of stages is a differential delay cell.

28. A method for generating a delay, comprising:
enabling an oscillator circuit having a signal path;
setting a programmable delay in the signal path;
measuring a total delay in the signal path; and
adjusting the programmable delay to attain a desired total delay in the signal path.

29. The method of claim 28, further comprising disabling the oscillator circuit.

30. The method of claim 29, further comprising inputting another signal into the signal path.

31. The method of claim 30, wherein at least a part of the signal path is part of a clock tree.

32. The method of claim 30, wherein the another signal is a clock signal.

* * * * *